United States Patent
Frischeisen et al.

(10) Patent No.: US 8,618,729 B2
(45) Date of Patent: Dec. 31, 2013

(54) ORGANIC LIGHT-EMITTING DIODE CONFIGURED SUCH THAT LIGHT IS EFFICIENTLY DECOUPLED FROM PLASMON MODES OF A METAL ELECTRODE

(75) Inventors: Joerg Frischeisen, Schwabmuenchen (DE); Stefan Nowy, Schwabmuenchen (DE); Wolfgang Bruetting, Augsburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 13/375,214

(22) PCT Filed: May 27, 2010

(86) PCT No.: PCT/EP2010/057346
§ 371 (c)(1),
(2), (4) Date: Mar. 21, 2012

(87) PCT Pub. No.: WO2010/136537
PCT Pub. Date: Dec. 2, 2010

(65) Prior Publication Data
US 2012/0181920 A1    Jul. 19, 2012

(30) Foreign Application Priority Data

May 29, 2009  (DE) .......................... 10 2009 023 352
Aug. 12, 2009  (DE) .......................... 10 2009 037 185

(51) Int. Cl.
*H05B 33/12*    (2006.01)
(52) U.S. Cl.
USPC ............. 313/504; 313/506; 313/507; 445/24; 445/25
(58) Field of Classification Search
CPC .... H05B 33/12; H01L 51/006; G02B 6/1226; B82Y 20/00
USPC .................... 313/500–511; 257/98, 100, 103; 445/24, 58
See application file for complete search history.

(56) References Cited

U.S. PATENT DOCUMENTS

2005/0194896 A1  9/2005  Sugita et al.
2006/0103321 A1  5/2006  Bechtel et al.
(Continued)

FOREIGN PATENT DOCUMENTS

DE    10 2008 022 830 A1    6/2009
WO    WO 2004/001796 A2    12/2003
(Continued)

OTHER PUBLICATIONS

Andrew, P. et al. "Energy Transfer Across a Metal Film Mediated by Surface Plasmon Polaritons." Science, vol. 306, 5. Nov. 2004, pp. 1002-1005.
(Continued)

*Primary Examiner* — Tracie Y Green
(74) *Attorney, Agent, or Firm* — Cozen O'Connor (57) ABSTRACT

In at least one embodiment of the organic light-emitting diode (10), the latter comprises a first electrode (1), which is formed with a metal, and a second electrode (2). In addition, the organic light-emitting diode (10) contains an organic layer sequence (3) located between the first electrode (1) and the second electrode (2). Moreover, the organic light-emitting diode (10) comprises a radiation-transmissive index layer (4), which is located on an outer side (11) of the first electrode (1) remote from the organic layer sequence (3). The average refractive index of the index layer (4) is greater than or equal to the average refractive index of the organic layer sequence (3). At least some of the electromagnetic plasmon radiation (P) generated by the organic light-emitting diode (10) passes through the index layer (4).

17 Claims, 7 Drawing Sheets

(56) References Cited

U.S. PATENT DOCUMENTS

| | | | |
|---|---|---|---|
| 2006/0274611 A1* | 12/2006 | Challener | 369/13.33 |
| 2007/0063628 A1 | 3/2007 | Cok et al. | |
| 2007/0063641 A1 | 3/2007 | Cok et al. | |
| 2007/0132378 A1 | 6/2007 | Cok et al. | |
| 2008/0001538 A1 | 1/2008 | Cok | |
| 2008/0061687 A1 | 3/2008 | Cok et al. | |
| 2008/0237611 A1 | 10/2008 | Cok et al. | |
| 2009/0051271 A1* | 2/2009 | Birnstock et al. | 313/504 |
| 2009/0135582 A1 | 5/2009 | Miller et al. | |

FOREIGN PATENT DOCUMENTS

| | | |
|---|---|---|
| WO | WO 2006/134218 A1 | 12/2006 |
| WO | WO 2010/044489 A1 | 4/2010 |

OTHER PUBLICATIONS

Chau, J. et al. "Transparent High Refractive Index Nanocomposite Thin Films." ScienceDirect, Materials Letters, vol. 61, pp. 2908-2910. Year 2007.

Hobson, P. et al. "Surface Plasmon Mediated Emission From Organic Light-Emitting Diodes." Advanced Materials vol. 14, No. 19, pp. 1393-1367. Year 2002.

Huang, Q. et al. "Performance Improvement of Top-Emitting Organic Light-Emitting Diodes by an Organic Capping Layer: An Experimental Study." Journal of Applied Physics. American Institute of Physics, vol. 100, pp. 064507-1-064507-5. Year 2006.

Kretschmann, E. "The Determination of the Optical Constants of Metals by Excitation of Surface Plasmons." Zeitschrift für Physik, vol. 241, pp. 313-324. Year 1971.

Liu, C. et al. "Efficiency Enhancement of an Organic Light-Emitting Diode with a Cathode Forming Two-Dimensional Periodic Hole Array." Applied Physics Letters, vol. 86 pp. 143501-1-143501-3. Year 2005.

Lupton, J. et al. "Bragg Scattering From Periodically Microstructured Light Emitting Diodes." Applied Physics Letters, American Institute of Physics, vol. 77, No. 21, Nov. 20, 2000, pp. 3340-3342, XP012026694.

Nowy, S. et al. "Light Extraction and Optical Loss Mechanisms in Organic Light-Emitting Diodes." Organic Optoelectronics and Photonics III, Proc. of SPIE vol. 6999, Apr. 16, 2008, pp. 1-11, XP002593603.

Ran, G. et al. "Role of the Dielectric Capping Layer in Enhancement of Light Outcoupling for Semitransparent Metal-Cathode Organic Light-Emitting Devices." J. Opt. A: Pure Appl. Opt. 8, pp. 733-736. Year 2006.

Riel, H. et al. "Tuning the Emission Characteristics of Top-Emitting Organic Light-Emitting Devices by Means of a Dielectric Capping Layer: An Experimental and Theoretical Study." Journal of Applied Physics, vol. 94, No. 8, pp. 5290-5296. Year 2003.

Smith, L. et al. "Light Out-Coupling Efficiencies of Organic Light-Emitting Diode Structures and the Effect of Photoluminescence Quantum Yield." Advanced Functional Materials, vol. 15, pp. 1839-1844. Year 2005.

Tien, K. et al. "P-162: Recycling Surface Plasmon Polaritons of OLED for Tunable Double Emission and Efficiency Enhancement." Department of Electrical Engineering, SID 2007, Society for Information Display, vol. XXXVIII, Mai 20, 2007, pp. 806-809, XP007013484.

Wedge, S. et al. "Coupled Surface Plasmon-Polariton Mediated Photoluminescence From a Top-Emitting Organic Light-Emitting Structure." Applied Physics Letters, American Institute of Physics, vol. 85, No. 2, Jan. 1, 2004, pp. 182-184, XP012063335.

Zhang, X. et al. "Colour Tunability of Blue Top-Emitting Organic Light-Emitting Devices With Single-Mode Resonance and Improved Performance by Using C60 Capping Layer and Dual Emission Layer." Journal of Physics D.: Applied Physics 42 (2009) 145106 (8pp).

Ziebarth, J. et al. "A Theoretical and Experimental Investigation of Light Extraction From Polymer Light-Emitting Diodes." Journal of Applied Physics, vol. 97, pp. 064502-1-064502-7. Year 2005.

* cited by examiner

ORGANIC LIGHT-EMITTING DIODE CONFIGURED SUCH THAT LIGHT IS EFFICIENTLY DECOUPLED FROM PLASMON MODES OF A METAL ELECTRODE

RELATED APPLICATIONS

This is a U.S. national stage of application No. PCT/EP2010/057346, filed on May 27, 2010.

The present patent application claims priority from German patent applications 10 2009 023 352.0 filed 29 May 2009 and 10 2009 037 185.0 filed 12 Aug. 2009, the disclosure content of both of which is hereby incorporated by reference.

FIELD OF THE INVENTION

The invention relates to an organic light-emitting diode.

SUMMARY OF THE INVENTION

An object to be achieved is to provide an organic light-emitting diode, or OLED for short, in which light may be efficiently decoupled from plasmon modes of a metal electrode.

According to at least one embodiment of the organic light-emitting diode, the latter comprises a first electrode formed with a metal. For example, the first electrode consists of silver, aluminium, cadmium, barium, indium, magnesium, calcium, lithium and/or gold. The first electrode is thus in particular provided with an electrically conductive material, which is opaque even in the case of thin layers. In other words, the first electrode is preferably made with a material which, when present in a thickness of at least a quarter of a vacuum wavelength of radiation in the visible spectral range, is opaque to this radiation.

According to at least one embodiment of the organic light-emitting diode, the latter comprises at least one organic layer sequence with at least one active layer. The active layer is here designed to generate electromagnetic radiation. The active layer is based for example on an organic polymer, on an organic oligomer, on organic monomers, on small, non-polymeric organic molecules or on a combination thereof. The organic layer sequence may comprise further organic layers, which are configured for example as charge carrier injection layers, as charge carrier transport layers and/or as charge carrier stop layers.

According to at least one embodiment of the organic light-emitting diode, the latter comprises a second electrode. Both the second electrode and the first electrode are preferably of flat and/or planar configuration. Flat may mean that the electrodes cover at least 80% or all of the major faces of the organic layer sequence on mutually remote sides or that a ratio of the lateral extent and thickness of the electrodes amounts to at least 1000.

According to at least one embodiment of the organic light-emitting diode, the organic layer sequence is located between the first electrode and the second electrode. The organic layer sequence may in this case be located completely or partially between the electrodes.

According to at least one embodiment of the organic light-emitting diode, the latter comprises a radiation-transmissive index layer. The index layer is thus translucent or, preferably, transparent at least in sub-ranges of the visible spectral range. Furthermore, the index layer is preferably made with a dielectric material. The index layer may here be formed with a homogeneous, for example crystalline material or indeed of at least one metamaterial. If the index layer comprises a crystalline material, suitable materials are for example $LiNbO_2$, ZnS, ZnSe or $TeO_2$. Organic materials, such as $C_{60}$ with a refractive index of around 2.2, may likewise be used for or in the index layer.

A suitable metamaterial is for example $TiO_2$, which is embedded in a matrix material. Suitable matrix materials are for example polymers, in particular epoxides, silicones and epoxide-silicone hybrid materials.

According to at least one embodiment of the organic light-emitting diode, the index layer is applied to an outer side of the first electrode remote from the organic layer sequence. In other words the metallic first electrode is located between the index layer and the organic layer sequence.

According to at least one embodiment of the organic light-emitting diode, the average optical refractive index of the index layer is greater than or equal to the average refractive index of the organic layer sequence. Average refractive index here means that the refractive index is averaged over the entire layer thickness of the organic layer sequence or of the index layer, wherein layers of the index layer which are located closer to the first electrode may be more heavily weighted due to exponential plasmon mode decay in a direction away from the first electrode. The average refractive index may also be an effective refractive index of the respective layers. If the average and/or effective refractive index of the organic layer sequence amounts to 1.8, the average and/or effective refractive index of the index layer likewise amounts to at least 1.8.

According to at least one embodiment of the organic light-emitting diode, the latter comprises a front and a back. The back here faces the index layer or is formed by the index layer, and the front faces the organic layer sequence, i.e. the index layer is located at least in part between the back and the organic layer sequence and the organic layer sequence is located at least in part between the front and the index layer. Radiation generated in the light-emitting diode leaves the organic light-emitting diode at the front and/or at the back. The radiation preferably leaves the light-emitting diode at least at the front and optionally additionally at the back. Preferably no or no significant radiation fraction is emitted at side faces at right angles to the front of the light-emitting diode.

According to at least one embodiment of the organic light-emitting diode, at least some of the electromagnetic plasmon radiation generated by the organic light-emitting diode passes through the index layer. The plasmon radiation is radiation which is generated from surface plasmons of at least the first electrode.

In at least one embodiment of the organic light-emitting diode, the latter comprises a first electrode, which is formed with a metal, and a second electrode. Furthermore, the organic light-emitting diode contains an organic layer sequence with at least one active layer, the organic layer sequence being located between the first electrode and the second electrode. In addition, the organic light-emitting diode comprises a radiation-transmissive index layer which is located on an outer side of the first electrode remote from the organic layer sequence. An average refractive index of the index layer is here greater than or equal to an average refractive index of the organic layer sequence. The organic light-emitting diode furthermore comprises a front and a back, the back facing the index layer and the front facing the organic layer sequence and radiation generated in the light-emitting diode being emitted at the front and/or at the back. At least some of the electromagnetic plasmon radiation generated by the organic light-emitting diode passes through the index layer.

According to at least one embodiment, the first electrode is in direct physical contact both with the organic layer sequence and with the index layer. In other words, the first electrode is completely or partly defined and enclosed by the index layer and the organic layer sequence in a direction at right angles to a main direction of extension of the first electrode.

According to at least one embodiment of the organic light-emitting diode, surface plasmons are excited at least at the interface between the first electrode and the organic layer sequence by electromagnetic radiation generated in the active layer. The plasmon radiation is completely or partially generated by these surface plasmons.

The active layer of the organic layer sequence provided for generating radiation as a rule comprises molecules which in an electronically excited state approximately exhibit an electric dipole moment, wherein the molecules do not need to exhibit any dipole moment in an electronic ground state. There are furthermore electromagnetic interface modes at the boundary surface between the organic layer sequence and the metallic first electrode. The interface modes, also known as surface plasmon modes, may couple to the molecules of the organic layer sequence or vice versa by means of near field effects and/or by means of surface asperities. Using the total quantity of light generated by the active layer a reference, the order of magnitude of the extent of coupling to the surface plasmon modes may amount to around 30%. In other words a considerable proportion of the power of the organic light-emitting diode is transferred to the surface plasmons.

With an organic light-emitting diode which does not have an index layer configured as described, the proportion of power coupled to the surface plasmons is lost, in particular by damping of the surface plasmon modes in the metal of the first electrode, and is not converted into light. The index layer on the side of the first electrode remote from the organic layer sequence allows conservation of energy and of momentum to be achieved for the conversion of surface plasmons into electromagnetic radiation. This thus makes it possible for the surface plasmons to be converted into electromagnetic radiation at least in part at the outside of the first electrode.

This radiation, the plasmon radiation, generated from the surface plasmons of the first electrode, then passes at least in part through the index layer and exits the organic light-emitting diode for example at the back of the organic light-emitting diode, which is formed for instance by the index layer. By reconverting the surface plasmons in the first electrode into electromagnetic radiation, the efficiency of the organic light-emitting diode may be increased.

According to at least one embodiment of the organic light-emitting diode the index layer exhibits an average geometric thickness of at least 50 nm, in particular of at least 100 nm or at least 200 nm. The average geometric thickness of the index layer preferably exceeds at least 300 nm, in particular at least 500 nm. The index layer is thus of a thickness which corresponds at least to the order of magnitude of the wavelength of the electromagnetic radiation within the index layer.

According to at least one embodiment of the organic light-emitting diode, the first metallic electrode has a thickness of between 15 nm and 65 nm inclusive, preferably between 25 nm and 50 nm inclusive. If the first electrode is of a thickness in the stated range, the first electrode is very largely opaque to radiation, i.e. no significant proportion of the radiation generated in the active layer passes directly through the first electrode, without being reflected, absorbed or converted into surface plasmons. On the other hand, the thickness of the first electrode is sufficiently small in the stated range to ensure efficient transport of the surface plasmons from the inside of the first electrode, facing the organic layer sequence, to the outside of the first electrode. In the stated thickness range of the first electrode, plasmon radiation generation is thus particularly efficient.

According to at least one embodiment of the organic light-emitting diode, the average distance between the first electrode and the active layer is between 15 nm and 100 nm inclusive, preferably between 25 nm and 50 nm inclusive. To reduce coupling to the surface plasmons, in organic light-emitting diodes without an index layer configured as stated the distance between the first electrode and the active layer is as a rule selected to be as large as possible. As large as possible means here that the distance for example exceeds 100 nm. Since the index layer enables conversion of the surface plasmons into plasmon radiation, the distance between the active layer and the first electrode may be reduced.

According to at least one embodiment of the organic light-emitting diode, the average distance between the first electrode and the active layer is at most 25 nm, in particular at most 15 nm. Such a small distance between the active layer and the first electrode ensures particularly efficient coupling of the radiation generated in the active layer to the surface plasmon modes of the first electrode. In other words, a particularly large proportion of the power consumed by the organic light-emitting diode is converted into surface plasmons in at least the first electrode.

According to at least one embodiment of the organic light-emitting diode, the average geometric total thickness of the organic layer sequence is less than or equal to 150 nm, preferably less than or equal to 90 nm. Such a small total thickness of the organic layer sequence is made possible by recovery of the surface plasmons into the plasmon radiation, such that, due to the excitation of the surface plasmons, the total efficiency of the light-emitting diode does not or does not significantly reduce the efficiency of the light-emitting diode.

The small layer thickness of the organic layer sequence further improves the electrical characteristics of the organic light-emitting diode. Thus, due to the small thickness of the organic layer sequence, only a slight electrical voltage drop occurs at said sequence. Furthermore, the quantity of material required to produce the organic layer sequence may be reduced. In addition, the organic layer sequence no longer acts or at least acts far less as a waveguide layer than in the case of conventional light-emitting diodes. If the organic layer sequence does not act as a waveguide layer or acts only to a reduced extent as such, the outcoupling efficiency of the generated radiation may increase.

According to at least one embodiment of the organic light-emitting diode, the average emission intensity of the radiation generated by the light-emitting diode at the back of the light-emitting diode amounts to at least 5%, in particular at least 15%, of the average radiant intensity at the front of the light-emitting diode. In other words, a significant proportion of the radiant power emitted by the light-emitting diode is emitted at the back, i.e. on the side of the light-emitting diode remote from the organic layer sequence.

According to at least one embodiment of the organic light-emitting diode, the average radiant intensity at the back corresponds, with a tolerance of 25 percentage points, to the average radiant intensity at the front. The tolerance preferably amounts to at most 10 percentage points, in particular the average radiant intensity is equal at the back and at the front within the bounds of manufacturing tolerances. The ratio of the emission intensities at the front and at the back may be adjusted for example by the distance between the active layer and the first electrode, i.e. between the degree of coupling to the surface plasmon modes, and by the thickness and/or transparency of the metallic first electrode. An organic light-emitting diode may thus be obtained with in particular precisely one metallic electrode which emits light uniformly on both sides, i.e. at the front and at the back.

According to at least one embodiment of the organic light-emitting diode, the average refractive index of the index layer amounts to at least 1.1 times the average refractive index of the organic layer sequence. The average refractive index of the index layer preferably amounts to at least 1.2 times, in particular at least 1.3 times the average refractive index of the organic layer sequence. As a result of the comparatively large refractive index difference, efficient generation of the plasmon radiation from the surface plasmons may be ensured.

According to at least one embodiment of the organic light-emitting diode, the index layer is formed of alternately arranged layers, the alternately arranged layers each comprising different material compositions. The alternately arranged layers may for example alternately exhibit a comparatively high and a comparatively low refractive index.

According to at least one embodiment of the organic light-emitting diode, at least one of the alternately arranged layers is configured with a metal oxide which is transparent. For example the index layer is formed of an alternating sequence of ZnO layers and TiO layers and/or $SrTiO_3$ layers. The layers are each produced for example by atomic layer deposition or ALD for short. An index layer configured in this way has a high refractive index and a high level of transparency and is furthermore suitable for sealing the organic light-emitting diode against external influences such as oxygen and moisture.

According to at least one embodiment of the organic light-emitting diode, the back thereof is formed by the index layer, i.e. light is outcoupled from the organic light-emitting diode at the back, directly from the index layer.

According to at least one embodiment of the organic light-emitting diode, the index layer comprises patterning for increasing outcoupling of the plasmon radiation. The patterning may be regular or indeed irregular. For example, the patterning is produced by etching with an etching mask or by a random roughening process, such as for example grinding or sand blasting.

According to at least one embodiment of the organic light-emitting diode, a diffusion agent is added to the index layer. The diffusion agent is formed for example by scattering particles. In other words the plasmon radiation or at least some of the plasmon radiation does not pass in a linear manner through the index layer but rather the diffusion agent induces at least one change in direction, in particular by reflection and/or scattering. Use of a diffusion medium, in particular in combination with patterning of the index layer, makes it possible to achieve a high level of light outcoupling efficiency with regard to the plasmon radiation.

According to at least one embodiment of the organic light-emitting diode, the index layer contains a conversion medium. The conversion medium is designed to absorb at least part of the plasmon radiation and convert it into radiation of a larger wavelength. The conversion medium may also change the spatial emission characteristics of the light-emitting diode at the back, in particular by making said characteristics more uniform. The conversion medium may also be used in combination with the diffusion medium and with the patterning of the index layer.

According to at least one embodiment of the organic light-emitting diode, both the first electrode and the second electrode are made with a metal. Both electrodes are thus metallic electrodes. For example the organic light-emitting diode takes the form of a "microresonator OLED". The first electrode and the second electrode thus for example form a kind of resonator.

According to at least one embodiment of the organic light-emitting diode, in which in particular the first electrode and the second electrode are made with a metal, both electrodes exhibit a thickness of at most 30 nm, in particular of at most 15 nm. In other words, due to their small thickness, the two electrodes are partly transmissive for the visible radiation generated in the active layer.

According to at least one embodiment of the organic light-emitting diode, the second electrode is made with a transparent conductive oxide. The thickness of the second electrode then preferably exceeds 100 nm, in particular 200 nm. The thickness of the second electrode is preferably between 100 nm and 140 nm inclusive. For example the second electrode is made with or from indium oxide, indium-tin oxide, indium-zinc oxide, zinc oxide or tin oxide. The material for the second electrode may likewise comprise Al-doped zinc oxide, AZO for short.

According to at least one embodiment of the organic light-emitting diode, at least the first electrode exhibits a variation in thickness along at least one main direction of extension, preferably along two main directions of extension. In other words, the thickness of the first electrode varies for example periodically or randomly along the two orthogonal main directions of extension.

According to at least one embodiment of the organic light-emitting diode, a carrier of the light-emitting diode comprises patterning on a major side. The first and second electrodes and the organic layer sequence and the index layer are then applied to this major side, each preferably having a thickness which is constant over the entire major side within the bounds of manufacturing tolerances.

According to at least one embodiment of the organic light-emitting diode, a length scale of the variation in thickness and/or of the patterning is between 300 nm and 1.5 µm inclusive, preferably between 400 nm and 1.0 µm. The variation in thickness may here be a uniform or periodic variation, which proceeds for example sinusoidally or in steps and exhibits a periodicity corresponding to the length scale. It is likewise possible for the variation in thickness to take the form of holes in the first electrode, which are arranged at a regular distance from one another. It may also be the case that the length scale is an average length scale and the variation in thickness along the main directions of extension is irregular or random.

According to at least one embodiment of the organic light-emitting diode, a mirror is located on a side of the index layer remote from the first electrode, which mirror is designed to reflect the plasmon radiation towards the organic layer sequence. The use of such a mirror makes it possible for all the radiation generated by the organic light-emitting diode to be outcoupled from the organic light-emitting diode via the front. When using such a mirror the index layer preferably comprises a diffusion medium and/or patterning.

According to at least one embodiment of the organic light-emitting diode, the mirror is part of the index layer. For example, the mirror then takes the form of a Bragg mirror and the mirror layers are simultaneously sub-layers of the index layer. This makes it possible to achieved efficient encapsulation and/or a compact structure of the organic light-emitting diode.

BRIEF DESCRIPTION OF THE DRAWINGS

An organic light-emitting diode described herein is explained in greater detail below by way of exemplary embodiments with reference to the drawings. Elements which are the same in the individual figures are indicated with the same reference numerals. The features shown on the drawings are, however, not to scale relative to one another. Rather, individual elements may be illustrated on an exaggeratedly large scale for better comprehension.

In the drawings.

DETAILED DESCRIPTION OF THE DRAWINGS

Figure 1:
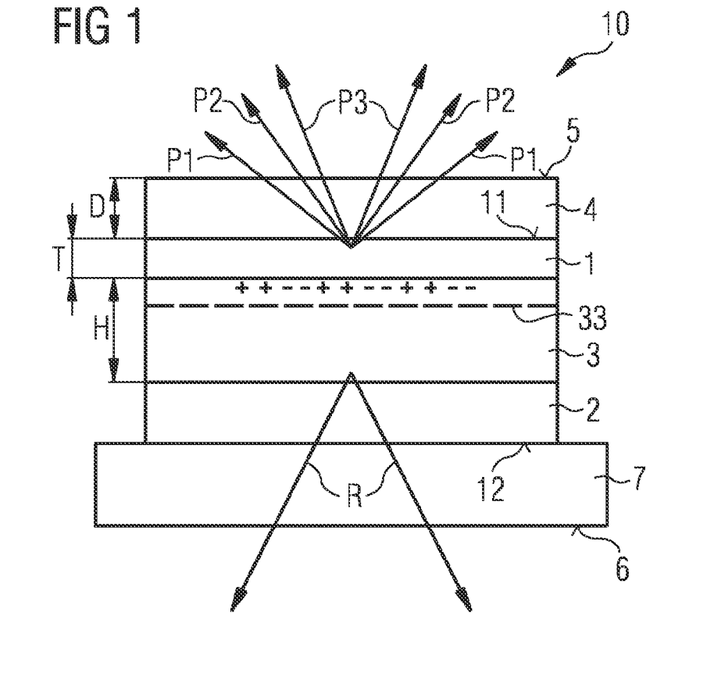
FIGS. 1 to 12 are schematic sectional representations of exemplary embodiments of organic light-emitting diodes described herein.

FIG. 1 shows an exemplary embodiment of an organic light-emitting diode 10. The light-emitting diode 10 comprises an organic layer sequence 3 with an active layer 33. When the light-emitting diode 10 is in operation, electromagnetic radiation R is generated in the active layer 33. A total thickness H of the organic layer sequence 33 amounts for example to at most 300 nm, in particular at most 90 nm. A second electrode 2 is located on a side of the layer sequence 3 facing a carrier 7. The second electrode 2 is made for example with a transparent conductive oxide. At least some of the radiation R generated in the active layer 33 is emitted at the front 6 of the light-emitting diode 10 through the second electrode 2 and the carrier 7.

A first electrode 1, made with a metal, for example silver, is located on a side of the organic layer sequence 3 remote from the carrier 7. As a result of the radiation generated in the active layer 33, surface plasmons +, − are excited at the interface between the first electrode 1 and the active layer sequence 3. These surface plasmons +, − may arrive at the outer side 11 of the first electrode 1 remote from the organic layer sequence 3. To allow this to proceed efficiently, the thickness D of the first electrode 11 preferably amounts to between 25 nm and 50 nm inclusive.

An index layer 4 is applied to the outer side 11 of the first electrode 1, in direct contact with the first electrode 1. An average refractive index of the index layer 4 is here at least as high or, preferably, higher than an average refractive index of the organic layer sequence 3. The index layer 4 also forms the back 5 of the light-emitting diode 10. Because the average refractive index of the index layer 4 is higher than the average refractive index of the organic layer sequence 3, it is possible for the surface plasmons +, − to be converted into plasmon radiation P1, P2, P3 in the first electrode 1. The plasmon radiation P1, P2, P3 passes at least partially through the index layer 4 and is emitted by the light-emitting diode 10 at the back 5. The thickness D of the index layer 4 here preferably amounts to at least 200 nm.

Due to the conservation of momentum and energy during conversion of the surface plasmons +, − into the plasmon radiation P1, P2, P3, emission of the plasmon radiation P1, P2, P3 is angle-dependent relative to wavelength. The wavelength of plasmon radiation P1 is thus smaller than the wavelength of plasmon radiation P2, which is in turn smaller than the wavelength of plasmon radiation P3. The smaller is the wavelength of the plasmon radiation P1, P2, P3, the smaller is therefore the angle at which the plasmon radiation P1, P2, P3 extends to a main direction of extension of the first electrode 1 through the index layer 4.

Figure 2:
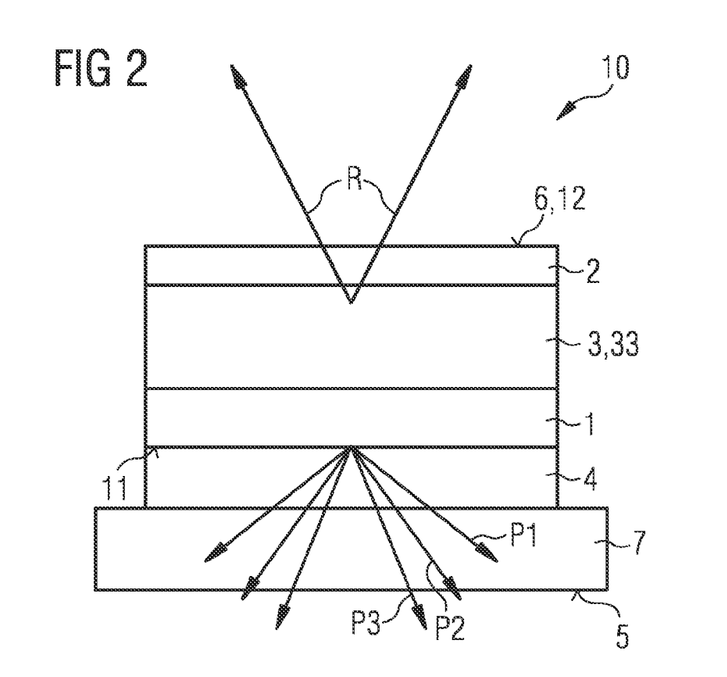

In the exemplary embodiment according to FIG. 2 the index layer 4 is located between the substrate 7 and the first electrode 1. The back 5 is formed by the substrate 7 and the front 6 by an outer side 12 of the second electrode 2 remote from the organic layer sequence 3. The plasmon radiation P1, P2, P3 is emitted from the light-emitting diode 10 through the substrate 7.

Unlike in FIG. 1 or 2, the substrate 7 may exhibit roughening to improve outcoupling efficiency.

Figure 3:
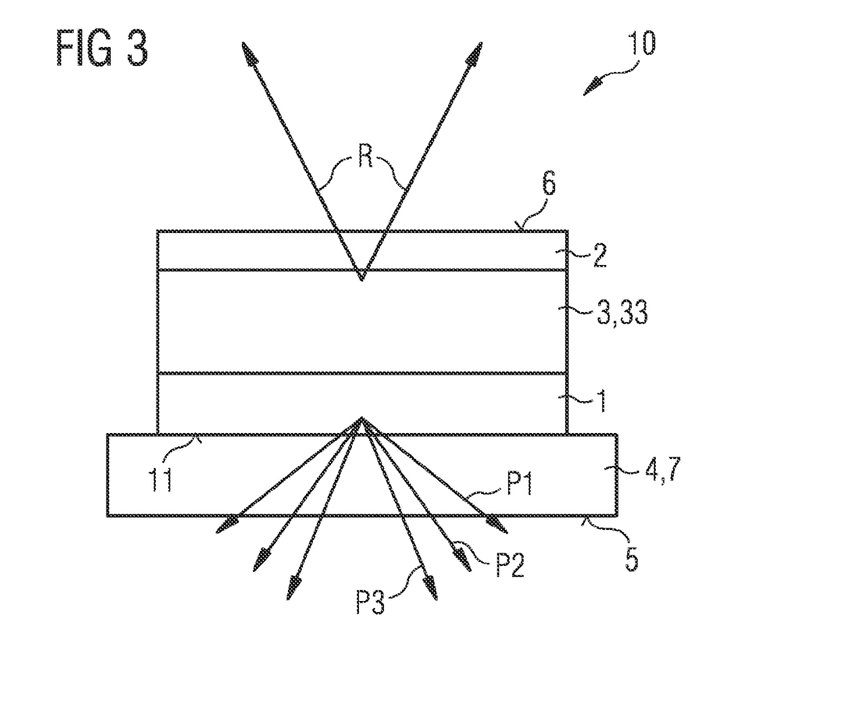

According to FIG. 3 the substrate 7 itself forms the index layer 4. The substrate 7 is thus made with a material which has a refractive index which is at least as high as the average refractive index of the organic layer sequence 3. The refractive index difference between the organic layer sequence 3 and the substrate 7 preferably amounts to at least 0.2 or at least 0.3. For example the refractive index of the substrate 7 then amounts to around 2.1 and the average refractive index of the organic layer sequence 3 to around 1.8, in particular with a tolerance of in each case 0.1 or 0.05.

Figure 4:
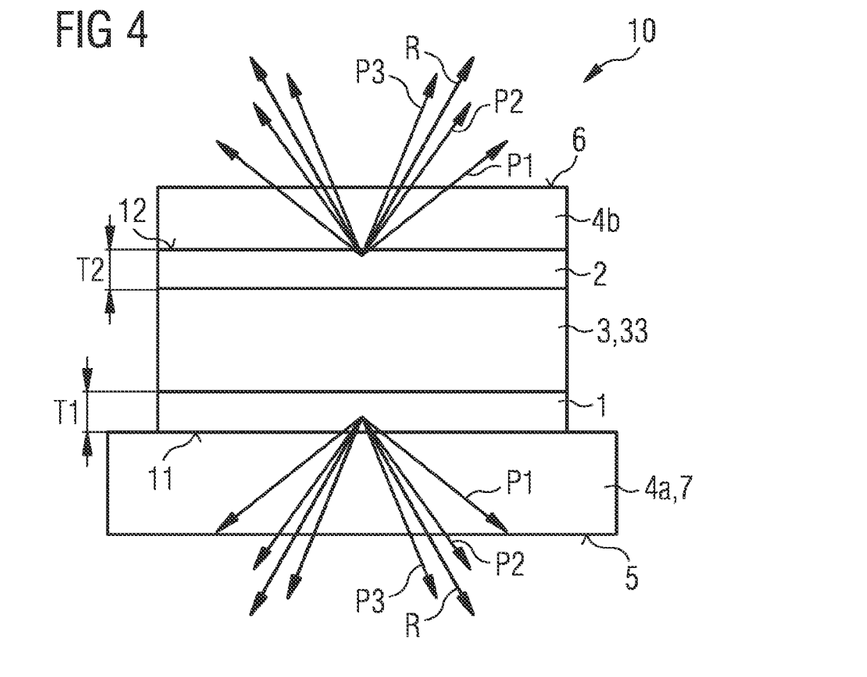

The organic light-emitting diode 10 is constructed in FIG. 4 as a microresonator light-emitting diode. Both the first electrode 1 and the second electrode 2 are in each case made from a metal, for example in each case silver. Preferably, however, the electrodes 1, 2 comprise different metals or consist of different metals. The index layers 4a, 4b are located on both the outer side 11 of the first electrode 1 and the outer side 12 of the second electrode 2. It is optionally possible for the index layer 4a on the first electrode 1 at the same time to constitute the carrier 7.

The thicknesses D1, D2 of the first electrode 1 and the second electrode 2 may be adjusted in such a way both that the surface plasmons and thus a plasmon radiation P1, P2, P3 is generated and that the radiation R generated directly in the active layer 3 may pass at least in part through at least one of the electrodes 1, 2. This makes it possible, as in the exemplary embodiments according to for instance FIGS. 1 to 3, for emission intensities of virtually equal magnitude to be achieved both at the front 6 and at the back 5 of the light-emitting diode 10.

Figure 5:
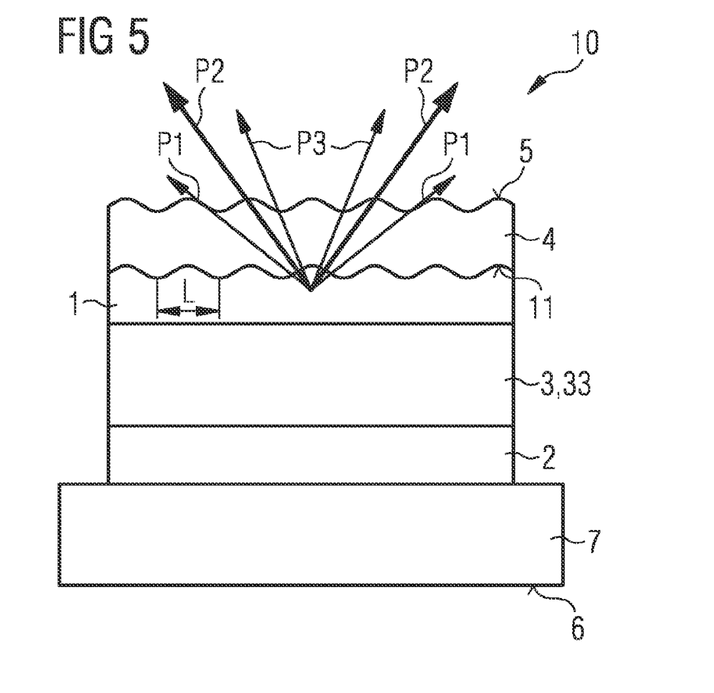

According to the exemplary embodiment according to FIG. 5, the first electrode 1 exhibits a variation in thickness with a length scale L along a main direction of extension. The length scale L is here preferably of the order of magnitude of the vacuum wavelength of the emitted plasmon radiation P1, P2, P3. For example, the variation in thickness has a periodic, sinusoidal profile.

The index layer 4, unlike in FIG. 5, may optionally also exhibit a variation in thickness. It is likewise possible, at variance with the illustration in FIG. 5, for the second electrode 2 to exhibit a variation in thickness and for the layers 3-5 remote from the substrate 7 when viewed from the second electrode 2 to have a constant thickness. A side of the substrate 7 facing the organic layer sequence 3 may also be patterned, the further layers 2-5 then preferably exhibiting a constant thickness.

The variation in thickness on the length scale L of the wavelength of the plasmon radiation P1, P2, P3 results in a kind of optical grating on the first electrode 1.

This makes it possible to adjust the angle dependence of the emitted plasmon radiation P1, P2, P3. For example, the intensity of plasmon radiation P2 exceeds the intensities of plasmon radiations P1, P3.

To simplify the illustration, in FIG. 5 and the following figures the radiation R generated directly in the active layer 33 is not shown.

Figure 6:
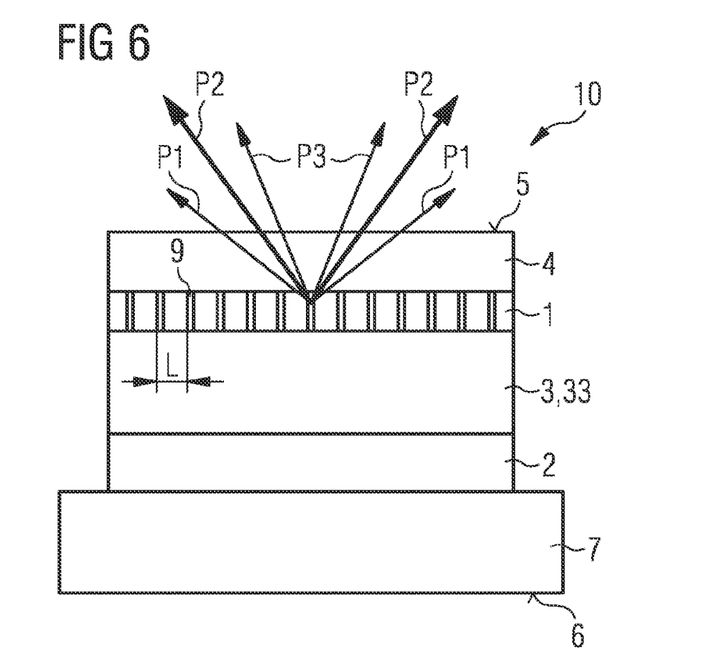

According to FIG. 6 the first electrode 1 comprises holes 9. The holes 9 pass for example completely through the first electrode 1 and may be produced by a photolithographic process. The diameter of the holes 9 is for example between 100 nm and 200 nm inclusive. The holes 9 in the first electrode 1 likewise make it possible to produce a kind of optical grating at the back 5 for adjusting the emission characteristics.

Figure 7:
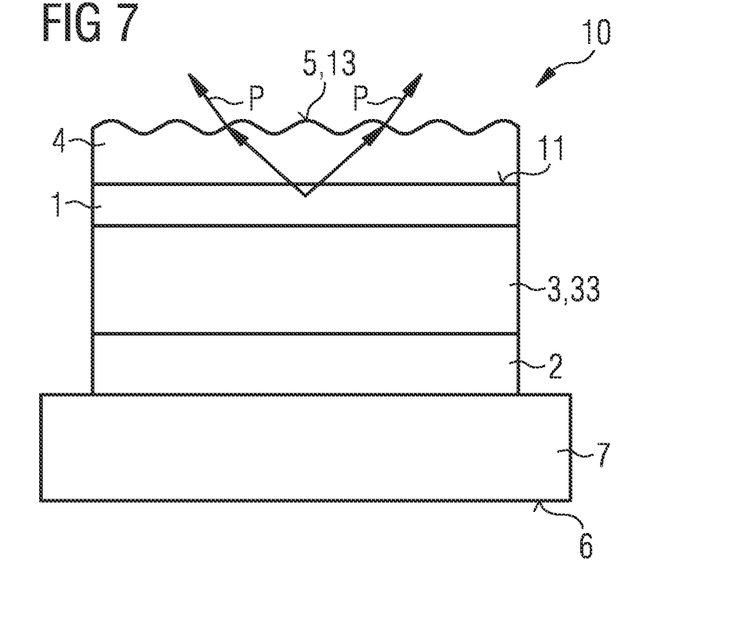

FIG. 7 shows that the index layer 4 preferably exhibits patterning 13 for increasing the outcoupling efficiency of the plasmon radiation P.

Figure 8:
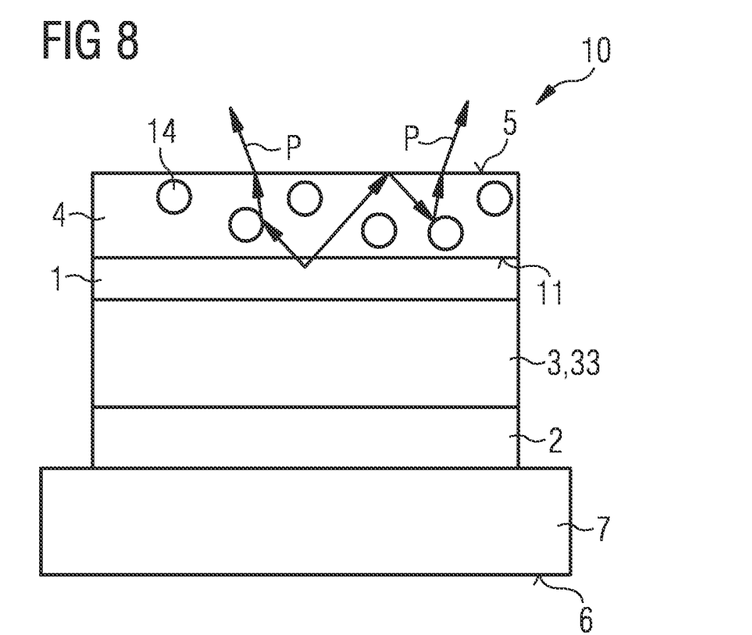

According to FIG. 8 the index layer 4 comprises a diffusion medium 14 in the form of scattering particles. As a result of the scattering particles 14 the plasmon radiation P passes through the index layer 4, at least in part, in non-linear manner, instead being deflected or reflected at the scattering particles. In this way the outcoupling efficiency of the plasmon radiation P from the index layer 4 may likewise be increased.

Figure 9:
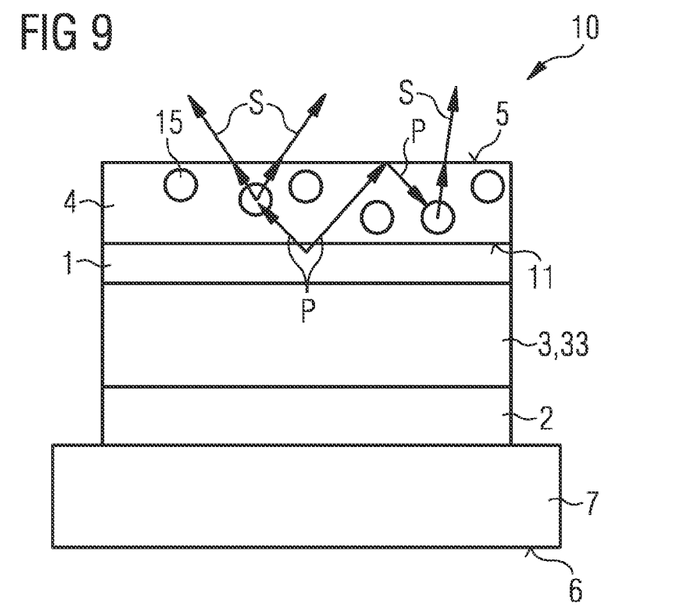

In the exemplary embodiment according to FIG. 9 a conversion medium 15 is added to the index layer 4. At least some of the plasmon radiation P is absorbed by particles of the conversion medium 15 and converted into secondary radiation S of a larger wavelength. Use of the conversion medium 15 allows the emission characteristics of the emitted radiation P, S to be homogenised, i.e. made more uniform. The conversion medium 15 may be selected such that for example only a blue and a green spectral component of the plasmon radiation is converted into the secondary radiation S and for instance a red component of the plasmon radiation P is emitted unconverted at the back 5.

Figure 10:
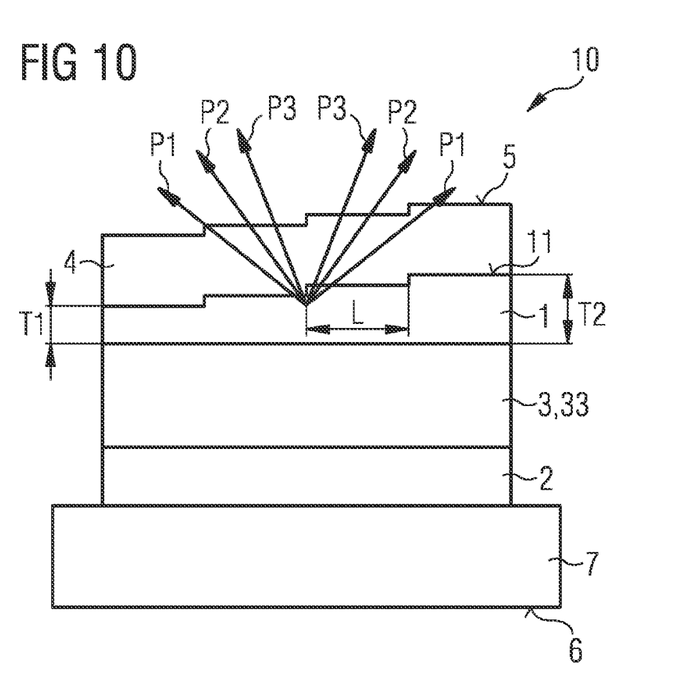

According to FIG. 10 the first electrode 1 varies in thickness in stepped manner. This variation in thickness makes it possible for different efficiencies for conversion of the surface plasmons into plasmon radiation P1, P2, P3 to be present at different points of the first electrode 1 for different wavelengths of the plasmon radiation P1, P2, P3. The variation in thickness of the first electrode 1 then allows the emission characteristics at the back 5 to be influenced and configured, even without patterning of the first electrode 1 in the manner of an optical grating.

Figure 11:
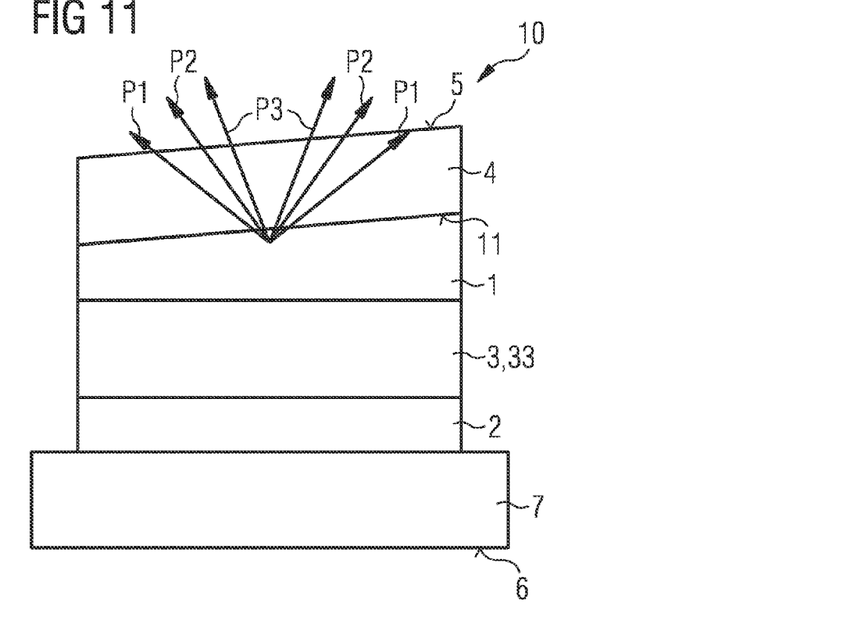

In the exemplary embodiment according to FIG. 11, the variation in thickness of the first electrode 1 is not stepped, as in FIG. 10, but rather sloped like a ramp. As in FIG. 10, the periodicity of the ramp-like variation in thickness is preferably larger than the wavelength of the plasmon radiation P1, P2, P3.

Figure 12:
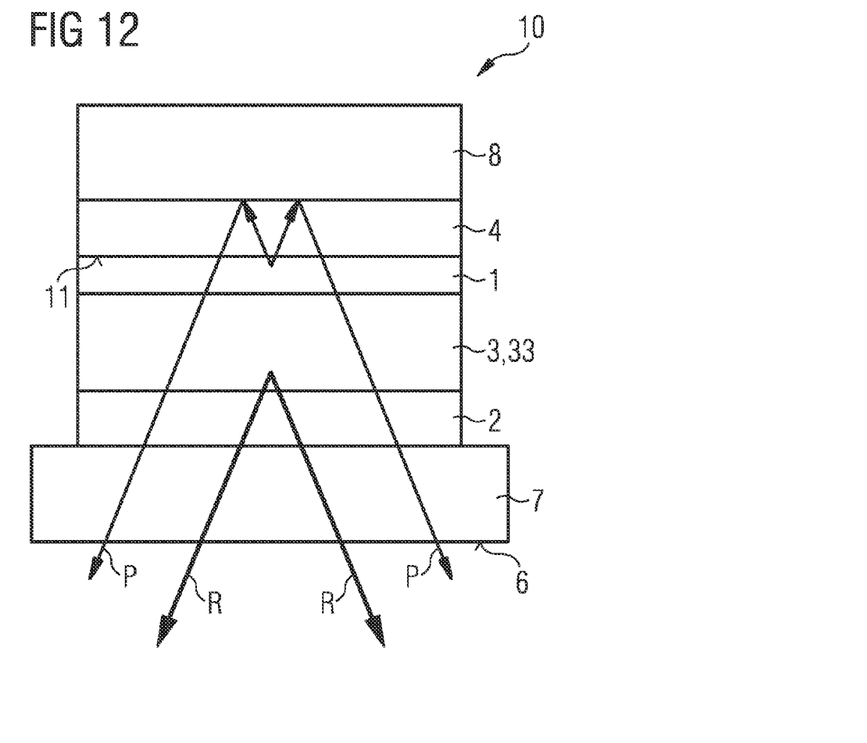

FIG. 12 shows an exemplary embodiment of the light-emitting diode 10 in which a mirror 8 is applied to a side of the index layer 4 remote from the organic layer sequence 3. The plasmon radiation P is reflected by way of the mirror 8 towards the substrate 7, such that both the plasmon radiation P and the radiation R generated directly in the active layer 33 are emitted from the light-emitting diode 10 via the front 6. The index layer 4 here preferably comprises a scattering medium not included in FIG. 12. It is furthermore possible for the mirror 8 to be embodied as part of the index layer 4.

Figure 13:
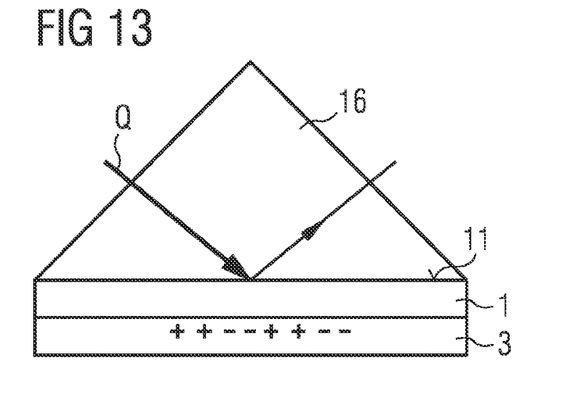
FIG. 13 is a schematic sectional representation of a schematic diagram.

FIG. 13 shows a so-called "Kretschmann" configuration. A glass prism 16 is applied to the first electrode 1. An organic layer 3 is additionally applied to the side of the first electrode 1 remote from the glass prism 16. Radiation Q of a specific wavelength is directed into the glass prism 16. A given proportion of the radiation Q is converted into the surface plasmons +, − as a function of the angle of incidence of the radiation Q, the wavelength of the radiation Q and the refractive index of the glass prism 16 and the organic layer 3. In this case it is possible for all the radiation Q to be converted into surface plasmons +, −. Compared with the organic light-emitting diode 10, for instance according to FIGS. 1 to 12, in the Kretschmann configuration the converse situation applies, the radiation Q thus being converted into the surface plasmons +, −.

Figure 14:
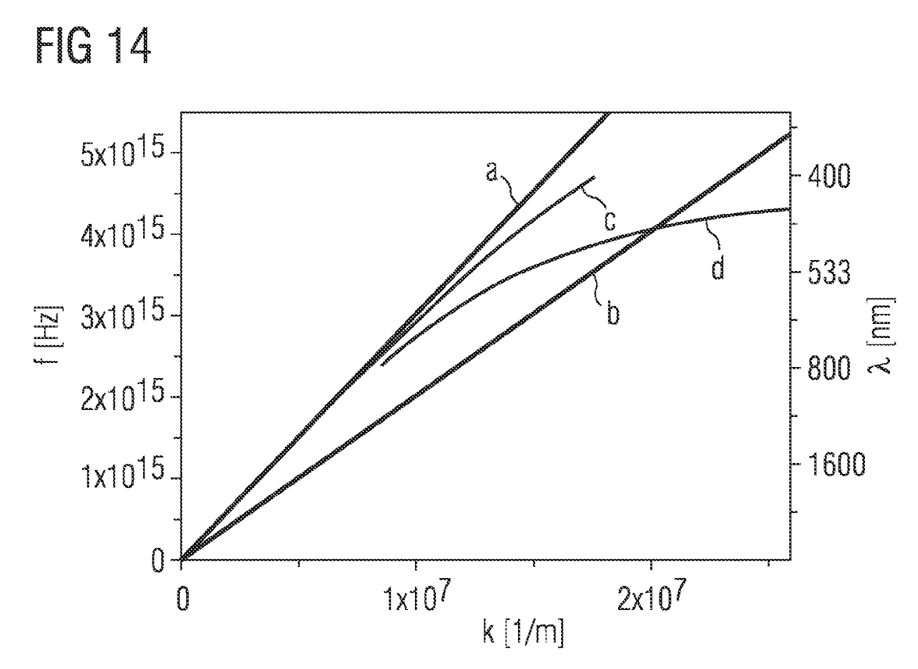
FIG. 14 is a schematic representation of dispersion relations of surface plasmons.

FIG. 14 is a schematic representation of a dispersion relation of the surface plasmons +, −. A wave vector k is here plotted in $m^{-1}$ against a wavelength λ in nm and a frequency f in Hz. Conversion of the radiation Q into the surface plasmons +, − is possible relative to the dispersion relation only from a curve located further to the right to a curve located further to the left.

Curve a is a schematic representation of the dispersion relation in air, curve b is a schematic representation of the dispersion relation in a medium with refractive index 1.5, curve c is a schematic representation of the dispersion relation for surface plasmons at an air/silver interface and curve d is a schematic representation of the dispersion relation for surface plasmons at a silver/organic interface, the organic material having a thickness of around 30 nm.

The converse, i.e. the conversion of surface plasmons +, − into plasmon radiation P is accordingly only possible when the refractive index of the medium in which the surface plasmons are converted into plasmon radiation P, in the present case therefore the index layer 4, is sufficiently large.

The invention described herein is not restricted by the description given with reference to the exemplary embodiments. Rather, the invention encompasses any novel feature and combination of features, including in particular any combination of features in the claims, even if this feature or this combination of features is not itself explicitly indicated in the claims or exemplary embodiments.

The invention claimed is:

1. An organic light-emitting diode comprising:
 a metallic first electrode, which consists of silver, aluminum, barium, magnesium, calcium, lithium, and/or gold, and a second electrode;
 an organic layer sequence having at least one active layer, the organic layer sequence being located between the first electrode and the second electrode;
 a radiation-transmissive index layer, which is located directly on an outer side of the first electrode remote from the organic layer sequence; and
 a front and a back, the back facing the index layer and the front facing the organic layer sequence and radiation generated in the light-emitting diode being emitted at the front and/or at the back,
 wherein at least some of an electromagnetic plasmon radiation generated by the organic light-emitting diode passes through the index layer,
 wherein an average refractive index of the index layer amounts to at least 1.2 times an average refractive index layer of the organic layer sequence, and
 wherein the index layer is a single layer.

2. The organic light-emitting diode according to claim 1, wherein surface plasmons are excited at least in the first electrode by at least some of the electromagnetic radiation generated in the active layer, and the plasmon radiation is generated by these surface plasmons.

3. The organic light-emitting diode according to claim 1, wherein the index layer has an average geometric thickness of at least 100 nm.

4. The organic light-emitting diode according to claim 1, wherein the first electrode has a thickness of between 25 nm and 65 nm inclusive.

5. The organic light-emitting diode according to claim 1, wherein an average distance between the first electrode and the active layer amounts to between 15 nm and 80 nm inclusive and/or in which an average geometric total thickness of the organic layer sequence amounts to at most 150 nm.

6. The organic light-emitting diode according to claim 1, wherein an average emission intensity of the radiation generated by the light-emitting diode at the back of the light-emitting diode amounts to at least 5% of an average emission intensity at the front of the light-emitting diode.

7. The organic light-emitting diode according to claim 6, wherein the average emission intensity at the back is equal to the average emission intensity at the front with a tolerance of 25 percentage points.

8. The organic light-emitting diode according to claim 1, wherein the index layer comprises at least two kinds of alternately arranged layers, at least one kind of layer being configured with a transparent metal oxide.

9. The organic light-emitting diode according to claim 1, wherein the back is formed by the index layer and in which the index layer comprises patterning for increasing outcoupling of the plasmon radiation.

10. The organic light-emitting diode according to claim 1, wherein the index layer contains a diffusion medium and/or a conversion medium.

11. The organic light-emitting diode according to claim 1, wherein both the first electrode and the second electrode are made with a metal.

12. The organic light-emitting diode according to claim 1, wherein the second electrode is made with a transparent conductive oxide.

13. The organic light-emitting diode according to claim 1, wherein the first electrode exhibits a variation in thickness along at least one main direction of extension, a length scale of the variation in thickness amounting to at least 300 nm and at most 1.5 µm.

14. The organic light-emitting diode according to claim 1, wherein a mirror is mounted on a side of the index layer remote from the first electrode, which mirror is designed to reflect the plasmon radiation towards the organic layer sequence.

15. An organic light-emitting diode comprising:
a metallic first electrode and a metallic second electrode;
an organic layer sequence having at least one active layer, the organic layer sequence being located between the first electrode and the second electrode;
radiation-transmissive index layers, which are located directly on outer sides of the first and the second electrode remote from the organic layer sequence; and
a front and a back which are main faces of the organic light-emitting diode, radiation generated in the light-emitting diode being emitted at the front and at the back,
wherein at least some of an electromagnetic plasmon radiation generated by the organic light-emitting diode passes through the index layers,
wherein the index layers have an average geometric thickness of at least 300 nm, and
wherein an average refractive index of the index layers amounts to at least 1.2 times an average refractive index of the organic layer sequence.

16. An organic light-emitting diode comprising:
a first electrode, which is formed with a metal, and a second electrode;
an organic layer sequence having at least one active layer, the organic layer sequence being located between the first electrode and the second electrode;
a radiation-transmissive index layer, which is located on an outer side of the first electrode remote from the organic layer sequence, the average refractive index of the index layer being greater than the average refractive index of the organic layer sequence; and
a front and a back, the back facing the index layer and the front facing the organic layer sequence and radiation generated in the light-emitting diode being emitted at the front and/or at the back,
wherein at least some of an electromagnetic plasmon radiation generated by the organic light-emitting diode passes through the index layer,
wherein the index layer is a single layer of a metamaterial, said metamaterial is $TiO_2$ which is embedded in a silicone as a matrix material.

17. The organic light-emitting diode of claim 15, wherein the metallic first electrode and metallic second electrode consist of silver, aluminum, barium, magnesium, calcium, lithium, and/or gold.

* * * * *

UNITED STATES PATENT AND TRADEMARK OFFICE
CERTIFICATE OF CORRECTION

PATENT NO. : 8,618,729 B2  
APPLICATION NO. : 13/375214  
DATED : December 31, 2013  
INVENTOR(S) : Joerg Frischeisen Page 1 of 1

It is certified that error appears in the above-identified patent and that said Letters Patent is hereby corrected as shown below:

In the Claims

Column 10, line 48 (penultimate line), delete "layer", first word.

Signed and Sealed this
Seventeenth Day of June, 2014

Michelle K. Lee
*Deputy Director of the United States Patent and Trademark Office*